United States Patent
Cao et al.

(10) Patent No.: US 11,329,606 B1
(45) Date of Patent: May 10, 2022

(54) OSCILLATOR CIRCUIT

(71) Applicant: INNOGRIT TECHNOLOGIES CO., LTD., Shanghai (CN)

(72) Inventors: Chi Cao, Shanghai (CN); Kangmin Hu, Santa Clara, CA (US)

(73) Assignee: INNOGRIT TECHNOLOGIES CO., LTD., Shanghai (CN)

( * ) Notice: Subject to any disclaimer, the term of this patent is extended or adjusted under 35 U.S.C. 154(b) by 0 days.

(21) Appl. No.: 17/326,548

(22) Filed: May 21, 2021

(30) Foreign Application Priority Data

Mar. 31, 2021 (CN) .......................... 202110349925.7

(51) Int. Cl.
*H03K 3/0231* (2006.01)
*H03K 3/012* (2006.01)
*H03B 5/12* (2006.01)

(52) U.S. Cl.
CPC ........... *H03B 5/1262* (2013.01); *H03K 3/012* (2013.01); *H03K 3/0231* (2013.01)

(58) Field of Classification Search
CPC ......... H03K 3/012; H03K 3/0231; H03K 4/50
USPC .................................. 331/111, 143
See application file for complete search history.

(56) References Cited

U.S. PATENT DOCUMENTS

| | | | |
|---|---|---|---|
| 4,584,494 A * | 4/1986 | Arakawa | H03K 17/284 327/126 |
| 6,727,768 B1 * | 4/2004 | Dasgupta | H03K 3/0231 331/1 A |
| 2011/0140754 A1 * | 6/2011 | Tokunaga | H03K 4/501 327/306 |
| 2013/0038364 A1 * | 2/2013 | Tokairin | H03L 7/099 327/156 |

OTHER PUBLICATIONS

Y. Tokunaga et al., "An on-chip CMOS relaxation oscillator with power averaging feedback using a reference proportional to supply voltage," 2009 IEEE International Solid-State Circuits Conference—Digest of Technical Papers, Feb. 2009, pp. 404-405, 405a, IEEE, San Francisco, CA, USA.

Y. Tokunaga et al., "An On-Chip CMOS Relaxation Oscillator With Voltage Averaging Feedback," IEEE Journal of Solid-State Circuits, Jun. 2010, pp. 1150-1158, vol. 45, No. 6, IEEE, New York, NY, USA.

\* cited by examiner

*Primary Examiner* — Levi Gannon

(74) *Attorney, Agent, or Firm* — Leydig, Voit & Mayer, Ltd.

(57) ABSTRACT

An oscillator circuit includes an integrator, a comparator, an edge triggered flip-flop, and first and second capacitors. The edge triggered flip-flop has an input terminal coupled to an output terminal of the comparator and is configured to output first and second signals which are mutually exclusive, and to flip the signals when detecting a rising or falling edge output by the comparator such that: when the first signal is at a designated level, the first capacitor is charged and the second capacitor is discharged, and a terminal of the first capacitor is coupled to an input terminal of the integrator; and when the second signal is at a designated level, the second capacitor is charged and the first capacitor is discharged and a terminal of the second capacitor is coupled to the input terminal of the integrator.

10 Claims, 2 Drawing Sheets

OSCILLATOR CIRCUIT

CROSS-REFERENCE TO PRIOR APPLICATION

Priority is claimed to Chinese Patent Application No. CN 2021103499257, filed on Mar. 31, 2021, the entire disclosure of which is hereby incorporated by reference herein.

FIELD

The present invention relates to electronic technology, especially to oscillator technology.

BACKGROUND

This section is intended to provide a background or context for embodiments of the present invention. The description here is not an admission of prior art by its inclusion in this section.

Resistance-capacitance (RC) oscillator circuits (including relaxation oscillator circuits) are widely used in various types of chips (e.g., low-power chip system clock, system-on-chip low-power mode clock, high-speed interface initialization clock, etc.) due to their low power consumption and high integration.

As shown in FIG. 1, the traditional relaxation oscillator circuit consists of a pair of current sources, an integrating capacitor, a pair of voltage comparators and a set/reset (SR) latch circuit. A period of an output clock depends on a sum of a charging and discharging time of the integrating capacitor and a logic delay generated by the comparator and the latch circuit. A disadvantage of the traditional relaxation oscillator circuit is that the logic delay generated by the comparator and the latch circuit will change according to the chip voltage and temperature, thereby the frequency of the output clock will change.

In order to solve the above disadvantage of the traditional relaxation oscillator circuit, Y. Tokunaga, et al. "An on-chip CMOS relaxation oscillator with power averaging feedback using a reference proportional to supply voltage," 2009 IEEE International Solid-State Circuits Conference-Digest of Technical Papers, San Francisco, Calif., 2009, pp. 404-405,405a, doi:10.1109/ISSCC.2009.4977479 propose a voltage average feedback oscillator circuit, as shown in FIG. 2. The voltage average feedback oscillator circuit dynamically adjusts a reference voltage of the comparator circuit, and absorbs the delay generated by the comparator and the latch circuit into the charging and discharging time, thereby improving the frequency stability of the output clock of the oscillator circuit. In addition, a low-bandwidth integral loop introduced by the voltage average feedback oscillator circuit suppresses low-frequency noise of the oscillator circuit and reduces jitter of the output clock.

Although the traditional voltage average feedback oscillator circuit has excellent performance, there are still three main disadvantages:

1) The implementation method is not optimized enough in terms of power consumption and hardware overhead. The typical implementation method requires two sets of RC charging circuits, two sets of voltage comparators, and one SR latch circuit.

2) The oscillator circuit alternately uses one of the two sets of RC charging circuits and one of the two voltage comparators every half period. Mismatch of on-chip components leads to mismatch of adjacent period durations, which in turn causes the oscillator output clock duty cycle to deviate from an ideal 50%.

3) The need to rely on complex control procedures to ensure reliable startup. The two sets of voltage comparators share the internal dynamically adjusted reference voltage, and the system may be in different states according to an initial state at startup. The reference voltage is affected by the voltage of the charging and discharging node, which in turn affects the output of the comparator, and the system may lock up in the initial state.

In order to be able to reliably startup the voltage average feedback oscillator circuit, it is necessary to first set the latch circuit to a reset state, then set an initial value of the reference voltage, and release two input terminals of the latch circuit after artificially introduce a sufficient delay. After completing the above three steps, the oscillator circuit can enter a normal operating mode. Y. Tokunaga, S. Sakiyama, "A. Matsumoto and S. Dosho, "An On-Chip CMOS Relaxation Oscillator With Voltage Averaging Feedback," in IEEE Journal of Solid-State Circuits, vol. 45, no. 6, pp. 1150-1158, June 2010, doi: 10.1109/JSSC.2010.2048732 discuss a reliable startup scheme.

It is worth mentioning that the overhead of the above-mentioned complicated startup procedure is not negligible for many systems. The relaxation oscillator in the system-on-chip often plays a role of an initialization clock in a crystal-less system. When it starts up, the system cannot provide the above-mentioned control flow due to lack of the clock signal.

SUMMARY

In an embodiment, the present invention provides an oscillator circuit. The oscillator circuit includes: an integrator; a comparator having two input terminals that are respectively coupled to an output terminal and a first input terminal of the integrator; an edge triggered flip-flop having an input terminal coupled to an output terminal of the comparator; and a first capacitor and a second capacitor. The edge triggered flip-flop is configured to output a first signal and a second signal which are mutually exclusive, and to flip the first signal and the second signal when detecting a rising edge or a falling edge output by the comparator such that: when the first signal is at a designated level, the first capacitor is charged and the second capacitor is discharged, and a first terminal of the first capacitor is coupled to the first input terminal of the integrator, and when the second signal is at a designated level, the second capacitor is charged and the first capacitor is discharged and a first terminal of the second capacitor is coupled to the first input terminal of the integrator.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

DETAILED DESCRIPTION

Figure 1:
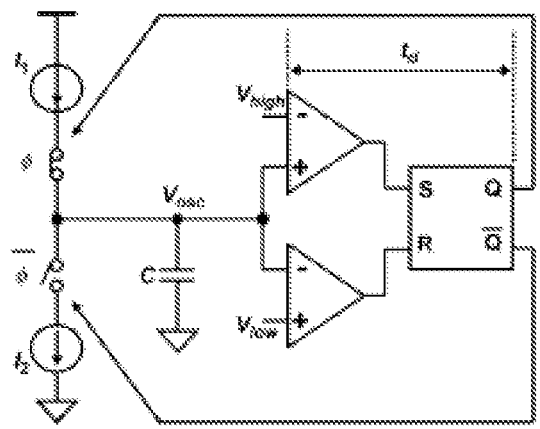
FIG. 1 is a schematic diagram of a structure of a traditional relaxation oscillator circuit in the prior art.
Figure 2:
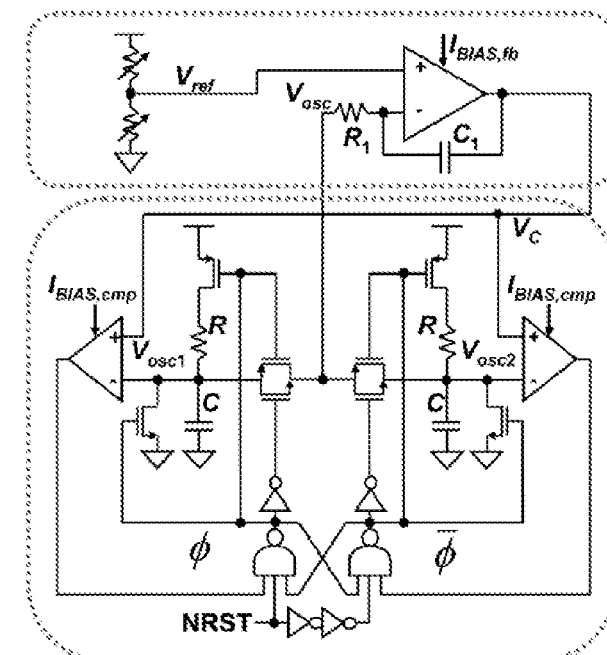
FIG. 2 is a schematic diagram of a structure of a voltage average feedback oscillator circuit in the prior art.

Embodiments of the present application provide an oscillator circuit that can avoid a complicated startup procedure while maintaining a stable output frequency, and achieve a better output clock duty cycle while optimizing the area and power consumption of the comparator by half.

In an embodiment, the present invention provides an oscillator circuit that comprises an integrator, a comparator, an edge triggered flip-flop, a first capacitor and a second capacitor, wherein: two input terminals of the comparator are respectively coupled to an output terminal and a first input terminal of the integrator; an output terminal of the comparator is coupled to an input terminal of the edge triggered flip-flop; the edge triggered flip-flop is configured to output a first signal and a second signal which are mutually exclusive, and to flip the first signal and the second signal when detecting a rising edge or a falling edge output by the comparator; when the first signal is at a designated level, the first capacitor is charged and the second capacitor is discharged, and a first terminal of the first capacitor is coupled to an input terminal of the integrator; and when the second signal is at a designated level, the second capacitor is charged and the first capacitor is discharged, and a first terminal of the second capacitor is coupled to the input terminal of the integrator.

In a preferred embodiment, the oscillator circuit further comprises a plurality of controlled switching devices, wherein: the plurality of controlled switching devices are controlled by the first signal and the second signal; when the first signal is at a designated level, the plurality of controlled switching devices are configured to charge the first capacitor and discharge the second capacitor, and the first terminal of the first capacitor is coupled to the input terminal of the integrator; and when the second signal is at a designated level, the plurality of controlled switching devices are configured to charge the second capacitor and discharge the first capacitor, and the first terminal of the second capacitor is coupled to the input terminal of the integrator.

In a preferred embodiment, the controlled switching device is a metal-oxide-semiconductor (MOS) transistor.

In a preferred embodiment, the oscillator circuit further comprises a first resistor and the plurality of controlled switching devices comprising first to sixth MOS transistors, wherein: gates of the first MOS transistor, the second MOS transistor and the third MOS transistor are coupled to a first signal; gates of the fourth MOS transistor, the fifth MOS transistor and the sixth MOS transistor are coupled to a second signal; a first terminal of the first resistor is coupled to a power supply; a source and a drain of the first MOS transistor are respectively coupled to a second terminal of the first resistor and the first terminal of the first capacitor; a source and a drain of the fourth MOS transistor are respectively coupled to the second terminal of the first resistor and the first terminal of the second capacitor; a second terminal of the first capacitor is coupled to a ground; a second terminal of the second capacitor is coupled to the ground; a source and a drain of the second MOS transistor are coupled in parallel with the second capacitor; a source and a drain of the fifth MOS transistor are coupled in parallel with the first capacitor; a source and a drain of the third MOS transistor are respectively coupled to the first terminal of the first capacitor and the first input terminal of the integrator; and a source and a drain of the sixth MOS transistor are respectively coupled to the first terminal of the second capacitor and the first input terminal of the integrator.

In a preferred embodiment, the edge triggered flip-flop is a rising edge triggered flip-flop, and is configured to flip the first signal and the second signal only when detecting the rising edge signal output by the comparator.

In a preferred embodiment, the oscillator circuit further comprise a first resistor and the plurality of controlled switching devices comprising first to sixth MOS transistors, wherein: gates of the first MOS transistor, the second MOS transistor and the third MOS transistor are coupled to the first signal; gates of the fourth MOS transistor, the fifth MOS transistor and the sixth MOS transistor are coupled to the second signal; a first terminal of the first resistor is coupled to a ground; a source and a drain of the first MOS transistor are respectively coupled to a second terminal of the first resistor and the first terminal of the first capacitor; a source and a drain of the fourth MOS transistor are respectively coupled to the second terminal of the first resistor and the first terminal of the second capacitor; a second terminal of the first capacitor is coupled to a power supply; a second terminal of the second capacitor is coupled to the power supply; a source and a drain of the second MOS transistor are coupled in parallel with the second capacitor; a source and a drain of the fifth MOS transistor are coupled in parallel with the first capacitor; a source and a drain of the third MOS transistor are respectively coupled to the first terminal of the first capacitor and the first input terminal of the integrator; and a source and a drain of the sixth MOS transistor are respectively coupled to the first terminal of the second capacitor and the first input terminal of the integrator.

In a preferred embodiment, the edge triggered flip-flop is a falling edge triggered flip-flop, and is configured to flip the first signal and the second signal only when detecting the falling edge signal output by the comparator.

In a preferred embodiment, a second input terminal of the integrator is coupled to a reference voltage.

In a preferred embodiment, the controlled switching device is a transmission gate.

In a preferred embodiment, the integrator comprises an operational amplifier, a second resistor, and a third capacitor, wherein: a first terminal of the second resistor serves as the first input terminal of the integrator; a second terminal of the second resistor is coupled to the first input terminal of the operational amplifier; a second input terminal of the operational amplifier is coupled to a reference voltage; a terminal of the third capacitor is coupled to the second terminal of the second resistor; and the other terminal is coupled to the output terminal of the operational amplifier.

The implementation of an embodiment of the present invention uses a combination of comparator reuse and an edge triggered flip-flop circuit instead of a circuit scheme of the dual comparators and the SR latch circuit. By adding delay and some useful logic functions (edge triggered flip-flop circuit and non-overlapping clock generation) in the system performance harmless logic delay part, the same comparator is used in both half periods, optimizing half of the area and power consumption with respect to prior art without affecting the overall performance; this structural optimization simplifies the circuit initial states, and provides the possibility for concise and reliable circuit startup.

The various technical features disclosed in the above summary of embodiments, the technical features disclosed in the various embodiments and examples below, and the various technical features disclosed in the drawings can be freely combined with each other to constitute various new technical solutions (all of which are considered to have been described in this specification), unless a combination of such technical features is not technically feasible. For example, features A+B+C is disclosed in one example, and features A+B+D+E is disclosed in another example, where features C and D are equivalent technical means that perform the same function, and it is technically feasible to only choose one, and not to adopt both at the same time. In this example, if feature E can be combined with feature C technically, then the A+B+C+D scheme should not be regarded as possible because of the technical infeasibility, but the A+B+C+E scheme should be considered as fully disclosed and supported.

In the following description, numerous technical details are set forth in order to provide the reader with a better understanding of the present application. However, those skilled in the art can understand that the technical solutions claimed in the present application can be implemented without these technical details and various changes and modifications based on the following embodiments.

Explanation of Some Concepts

Comparator: A circuit that compares an analog voltage signal with a reference voltage. Two input terminals of the comparator are analog signals, and an output is a binary signal 0 or 1, when a difference of the input analog voltages increases or decreases and a sign of positive or negative remains unchanged, the output remains constant.

Integrator: An electronic component whose output signal is an integral of an input signal over time.

Edge triggered flip-flop: A type of flip-flop that flips an output signal when detecting a certain predetermined transition (rising or falling edge) of an input signal. For example, assuming that an initial output signal is 0, when detecting a first rising edge of the input signal, the output signal is flipped from 0 to 1, and when detecting a second rising edge of the input signal, the output signal is flipped from 1 to 0, and when detecting a third rising edge of the input signal, the output signal is flipped from 0 to 1, . . . , and so on. The output signal can be multiple. For example, there may be two mutually exclusive output signals. Assuming that in an initial state, a first output signal is 0 and a second output signal is 1. When detecting a first falling edge of the input signal, the first output signal is flipped to 1, and the second output signal is flipped to 0; when detecting a second falling edge of the input signal, the first output signal is flipped to 0, and the second output signal is flipped to 1; when detecting a third falling edge of the input signal, the first output signal is flipped to 1, and the second output signal is flipped to 0; . . . , and so on.

Controlled switching device: A type of switching device that can be turned on or off under control of a control signal. For example, when the control signal is 1, the switching device is turned on, and when the control signal is 0, the switching device is turned off.

MOS transistor: Metal-Oxide-Semiconductor Field-Effect Transistor (MOSFET).

Figure 3:
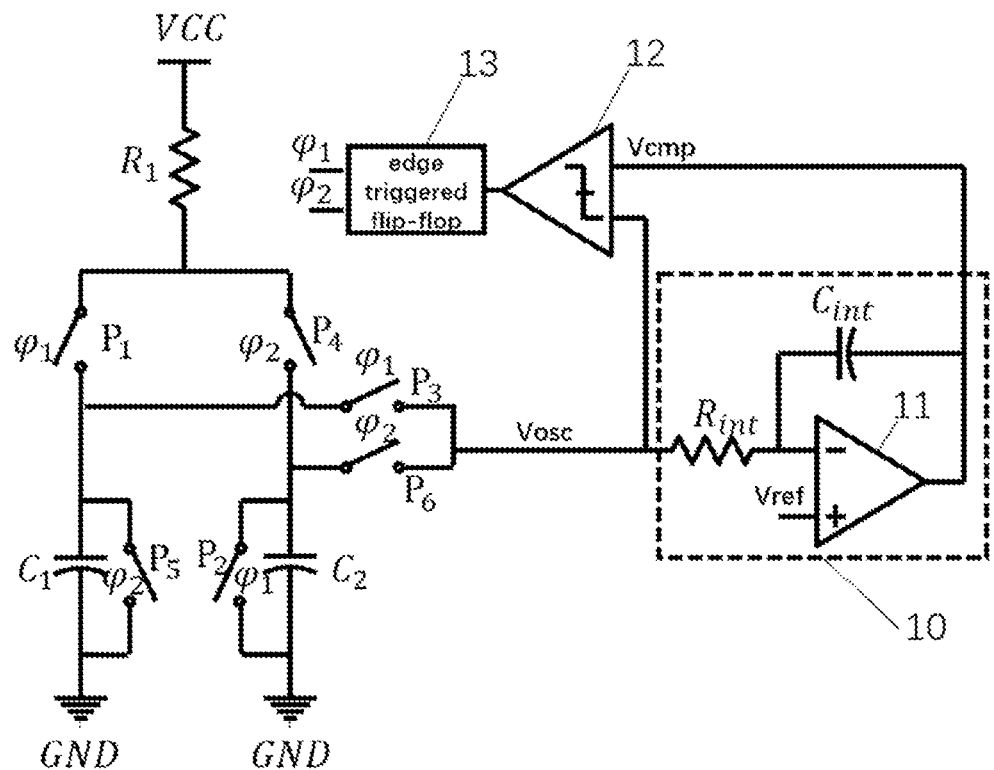
FIG. 3 is a schematic structural diagram of an oscillator circuit according to an embodiment of the present application.

An embodiment of the present application provides an oscillator circuit, as shown in FIG. 3, the oscillator circuit comprising: an integrator 10, a comparator 12, an edge triggered flip-flop 13, a first capacitor $C_1$ and a second capacitor $C_2$. Two input terminals of the comparator are respectively coupled to an output terminal and a first input terminal of the integrator. An output terminal of the comparator is coupled to an input terminal of the edge triggered flip-flop. A second input terminal of the integrator is coupled to a reference voltage Vref.

The edge triggered flip-flop 13 is configured to output, mutually exclusively, a first signal φ1 and a second signal φ2, and to flip the first signal and the second signal when detecting a rising edge (or a falling edge) output by the comparator. When the first signal is at a designated level, the first capacitor is charged and the second capacitor is discharged, and the first terminal of the first capacitor is coupled to an input terminal of the integrator. When the second signal is at a designated level, the second capacitor is charged and the first capacitor is discharged, and the first terminal of the second capacitor is coupled to an input terminal of the integrator. The designated level may be a high level (or a signal representing 1) or a low level (or a signal representing 0). Because the first signal and the second signal are mutually exclusive, when the first signal is at a designated level, the second signal is at a non-designated level; when the first signal is at a non-designated level, the second signal is at a designated level. The flip of the first signal and the second signal refers to flip between the two states of the designated level and the non-designated level.

In this implementation, the delay generated by the comparator and the edge triggered flip-flop is absorbed into the RC charging and discharging time, so as not to cause the oscillation period of the oscillator circuit to change with voltage and temperature.

This implementation replaces the structure of the two comparators and the SR latch circuit in the voltage average feedback oscillator circuit with the structure of a single comparator and an edge triggered flip-flop 13, which reduces the power consumption and area of one comparator, simplifies the possibility of system state and simplifies reliable startup conditions. The edge triggered flip-flop 13 adds an extra logic delay, but because this delay is also absorbed into the RC charging time similarly as the comparator delay, and is actually indistinguishable from the comparator delay, it will not cause the clock period to change with the voltage and temperature. The first signal φ1 and the second signal φ2 are non-overlapping clock signals generated by the edge triggered flip-flop circuit, are used to alternately charge and reset the two charging capacitors, and correctly connect the charging capacitors to the input terminals of the integrator and comparator. Benefiting from the simplification of the system brought by the comparators reuse, the oscillator circuit can be started in any signal (φ1, φ2) state (the opposite polarity of φ1, φ2 can be guaranteed by a non-overlapping clock generating circuit). The reliable startup of the oscillator circuit only needs to meet the reset state, preset voltages of the Vosc and Vcmp nodes, and release them at any time to enter the normal operating mode.

In an embodiment, the oscillator circuit also comprises a plurality of controlled switching devices P1-P6. The plurality of controlled switching devices are controlled by the first signal φ1 and the second signal φ2, wherein P1-P3 are controlled by the first signal φ1, and P4-P6 are controlled by the second signal φ2. When the first signal is at a designated level, the plurality of controlled switching devices are configured to charge the first capacitor and discharge the second capacitor, and the first terminal of the first capacitor is coupled to the input terminal of the integrator. When the second signal is at a designated level, the plurality of controlled switching devices are configured to charge the second capacitor and discharge the first capacitor, and the first terminal of the second capacitor is coupled to the input terminal of the integrator. At a designated level (such as a high level), the controlled switching device is turned on, and at a non-designated level (such as a low level), the controlled switching device is turned off.

In other embodiments, the number and configuration of the controlled switching devices are not limited to the manner in FIG. 3, as long as the following functions can be achieved: when the first signal is at a designated level, the first capacitor is charged and the second capacitor is discharged, and the first terminal of the first capacitor is coupled to an input terminal of the integrator; when the second signal is at a designated level, the second capacitor is charged and the first capacitor is discharged, and the first terminal of the second capacitor is coupled to the input terminal of the integrator.

The controlled switching device may be various, as long as they can be controlled by a control signal to realize the function of connection and disconnection. Optionally, in an embodiment, the controlled switching device is a MOS transistor. Optionally, in an embodiment, the controlled switching device is a transmission gate. Optionally, in an embodiment, the controlled switching device is a switching transistor. Optionally, in an embodiment, the controlled switching device may also be a combination of multiple devices.

Optionally, in an embodiment, as shown in FIG. 3, the oscillator circuit further comprises a first resistor R1. The plurality of controlled switching devices comprise first to sixth MOS transistors (respectively corresponding to positions of P1-P6; a source and a drain of the MOS transistor are corresponding to two terminals of the controlled switching device, for example, a source and a drain of the first MOS transistor can be respectively arranged at the two terminals of the controlled switching device P1). Gates of the first MOS transistor, the second MOS transistor and the third MOS transistor are coupled to the first signal. Gates of the fourth MOS transistor, the fifth MOS transistor and the sixth MOS transistor are coupled to the second signal. The first terminal of the first resistor is coupled to a power supply VCC. A source and a drain of the first MOS transistor are respectively coupled to the second terminal of the first resistor and the first terminal of the first capacitor. A source and a drain of the fourth MOS transistor are respectively coupled to the second terminal of the first resistor and the first terminal of the second capacitor. A second terminal of the first capacitor is coupled to a ground. A second terminal of the second capacitor is coupled to the ground. A source and a drain of the second MOS transistor are coupled in parallel with the second capacitor. A source and a drain of the fifth MOS transistor are coupled in parallel with the first capacitor. A source and a drain of the third MOS transistor are respectively coupled to the first terminal of the first capacitor and the first input terminal of the integrator. A source and a drain of the sixth MOS transistor are respectively coupled to the first terminal of the second capacitor and the first input terminal of the integrator. In this embodiment, the edge triggered flip-flop 13 is a rising edge triggered flip-flop, and to flip the first signal and the second signal only when detecting the rising edge signal output by the comparator. In other words, a falling edge will not cause the edge triggered flip-flop 13 to flip the first signal and the second signal. In this application, the source and the drain of the MOS transistor are respectively coupled to A or B, means that the source is coupled to A and the drain is coupled to B, or the source is coupled to B and the drain is coupled to A. The specific coupling method may depend on the type of the MOS transistor (P-type or N-type) and specific design method of the circuit.

Figure 4:
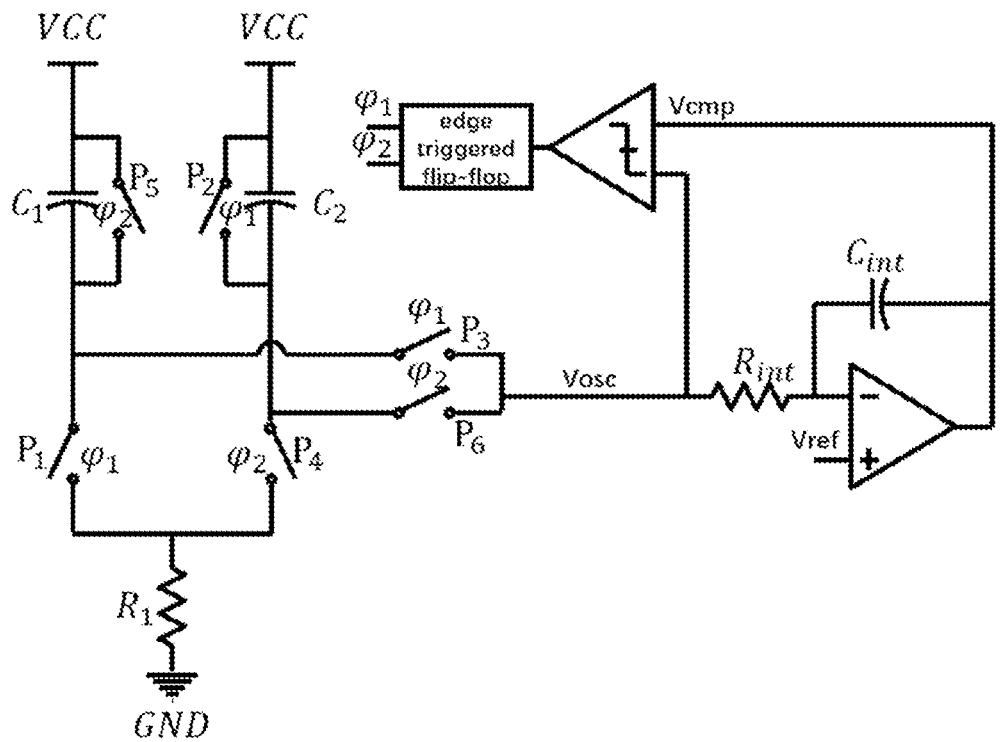
FIG. 4 is a schematic structural diagram of an oscillator circuit according to another embodiment of the present application.

Optionally, in an embodiment, the oscillator circuit has another variation, as shown in FIG. 4, wherein the plurality of controlled switching devices comprise first to sixth MOS transistors (respectively corresponding to positions of P1-P6); a source and a drain of the MOS transistor are corresponding to two terminals of the controlled switching device, for example, the source and the drain of the first MOS transistor can be respectively arranged at the two terminals of the controlled switching device P1). Gates of the first MOS transistor, the second MOS transistor and the third MOS transistor are coupled to the first signal. Gates of the fourth MOS transistor, the fifth MOS transistor and the sixth MOS transistor are coupled to the second signal. The first terminal of the first resistor R1 is coupled to the ground. A source and a drain of the first MOS transistor are respectively coupled to the second terminal of the first resistor and the first terminal of the first capacitor. A source and a drain of the fourth MOS transistor are respectively coupled to the second terminal of the first resistor and the first terminal of the second capacitor. A second terminal of the first capacitor is coupled to the power supply. A second terminal of the second capacitor is coupled to the power supply. A source and a drain of the second MOS transistor are coupled in parallel with the second capacitor. A source and a drain of the fifth MOS transistor are coupled in parallel with the first capacitor. A source and a drain of the third MOS transistor are respectively coupled to the first terminal of the first capacitor and the first input terminal of the integrator. A source and a drain of the sixth MOS transistor are respectively coupled to the first terminal of the second capacitor and the first input terminal of the integrator. In this embodiment, the edge triggered flip-flop is a falling edge triggered flip-flop, and to flip the first signal and the second signal only when detecting the falling edge signal output by the comparator.

Optionally, in other embodiments, other changes may also be made to the circuits in FIG. 3 and FIG. 4. For example, the resistor R1 in FIG. 3 may be implemented with two resistors, one of which is coupled between VCC and one terminal of the controlled switching device P1 (the upper terminal of P1 in FIG. 3), and the other is coupled between VCC and one terminal of the controlled switching device P4 (the upper terminal of P4 in FIG. 3). For another example, FIG. 4 can also be similarly changed. The resistor R1 in FIG. 4 may be implemented with two resistors, one of which is coupled between the ground and one terminal of the controlled switching device P1 (the lower terminal of P1 in FIG. 4), and the other is coupled between the ground and one terminal of the controlled switching device P4 (the lower terminal of P4 in FIG. 4).

The integrator is an existing technology and can be implemented in multiple methods. Optionally, in an embodiment, the integrator comprises an operational amplifier 11, a second resistor Rint, and a third capacitor Cint (as shown in FIG. 3). A first terminal of the second resistor serves as the first input terminal of the integrator, and a second terminal of the second resistor is coupled to the first input terminal of the operational amplifier. A second input terminal of the operational amplifier is coupled to the reference voltage. A terminal of the third capacitor is coupled to the second terminal of the second resistor, and the other terminal is coupled to the output terminal of the operational amplifier.

Optionally, in an embodiment, the above-mentioned oscillator circuit may be used in an integrated circuit as a part of the integrated circuit. The integrated circuit may be a SOC (system-on-chip).

Optionally, in an embodiment, the above-mentioned oscillator circuit may be used in a digital clock circuit to provide an oscillating signal for the digital clock circuit.

The implementation according to an embodiment uses a combination of single comparator reuse and an edge triggered flip-flop circuit instead of a circuit scheme of the dual comparators and the SR latch circuit. By adding delay and some useful logic functions (edge triggered flip-flop circuit and non-overlapping clock generation) in the system performance harmless logic delay part, half of the area and power consumption of the comparator are optimized through the comparator reuse in both half periods without affecting the overall performance; this structural optimization simplifies the possible state of the circuit at startup, and provides the possibility for concise and reliable circuit startup.

It should be noted that in the application documents of the present invention, relational terms such as a first and a second, and so on are only configured to distinguish one entity or operation from another entity or operation, and do not necessarily require or imply any such actual relationship or order between these entities or operations. Furthermore, the term "comprises" or "comprising" or "includes" or any other variations thereof is intended to encompass a non-exclusive inclusion, such that a process, method, item, or device that comprises a plurality of elements includes not only those elements but also other elements, or elements that are inherent to such a process, method, item, or device. Without more restrictions, the element defined by the phrase "comprises a/an" does not exclude that there are other identical elements in the process, method, item or device that comprises the element. In the application, if it is mentioned that an action is performed according to an element, it means the meaning of performing the action at least according to the element, and includes two cases: the behavior is performed only on the basis of the element, and the behavior is performed based on the element and other elements. Multiple, repeatedly, various, etc., expressions include 2, twice, 2 types, and 2 or more, twice or more, and 2 types or more types.

The term "coupled to" and its derivatives can be used herein. "Coupled" may mean that two or more elements are in direct physical or electrical contact. However, "coupled" may also mean that two or more elements are indirectly in contact with each other, but still cooperate or interact with each other, and may mean that one or more other elements are coupled between elements that are said to be coupled to or connected with each other.

The specification includes combinations of the various embodiments described herein. Separate references to embodiments (such as "one embodiment" or "some embodiments" or "preferred embodiments") do not necessarily refer to the same embodiment; however, these embodiments are not mutually exclusive unless indicated as mutually exclusive or clearly mutually exclusive by those skilled in the art. It should be noted that unless the context clearly indicates or requires otherwise, the word "or" is used in this specification in a non-exclusive sense.

All documents mentioned in the application are considered to be included in the application of the disclosure as a whole, so that they can be used as a basis for modification when necessary. In addition, it should be understood that various changes and modifications may be made by those skilled in the art after reading the above disclosure of the present application.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. An oscillator circuit, comprising:
    an integrator;
    a comparator, wherein a first terminal of the comparator is coupled to an output terminal of the integrator and a second terminal of the comparator is coupled to a first input terminal of the integrator;
    an edge triggered flip-flop having an input terminal coupled to an output terminal of the comparator; and
    a first capacitor and a second capacitor,
    wherein the edge triggered flip-flop is configured to output a first signal and a second signal which are mutually exclusive, and to flip the first signal and the second signal when detecting a rising edge or a falling edge output by the comparator such that:
    when the first signal is at a designated level, the first capacitor is charged and the second capacitor is discharged, and a first terminal of the first capacitor is coupled to the second terminal of the comparator, and
    when the second signal is at a designated level, the second capacitor is charged and the first capacitor is discharged and a first terminal of the second capacitor is coupled to the second terminal of the comparator.

2. The oscillator circuit of claim 1, further comprising a plurality of controlled switching devices, the plurality of controlled switching devices being controlled by the first signal and the second signal such that:
    when the first signal is at a designated level, the plurality of controlled switching devices are configured to charge the first capacitor and discharge the second capacitor, and the first terminal of the first capacitor is coupled to the first input terminal of the integrator;

when the second signal is at a designated level, the plurality of controlled switching devices are configured to charge the second capacitor and discharge the first capacitor, and the first terminal of the second capacitor is coupled to the first input terminal of the integrator.

3. The oscillator circuit of claim 2, wherein the controlled switching devices include a metal-oxide-semiconductor (MOS) transistor.

4. The oscillator circuit of claim 3, further comprising a first resistor, wherein:
the plurality of controlled switching devices comprise first to sixth MOS transistors;
gates of the first MOS transistor, the second MOS transistor and the third MOS transistor are coupled to the first signal;
gates of the fourth MOS transistor, the fifth MOS transistor and the sixth MOS transistor are coupled to the second signal;
a first terminal of the first resistor is coupled to a power supply;
a source and a drain of the first MOS transistor are respectively coupled to a second terminal of the first resistor and the first terminal of the first capacitor;
a source and a drain of the fourth MOS transistor are respectively coupled to the second terminal of the first resistor and the first terminal of the second capacitor;
a second terminal of the first capacitor is coupled to ground;
a second terminal of the second capacitor is coupled to ground;
a source and a drain of the second MOS transistor are coupled in parallel with the second capacitor;
a source and a drain of the fifth MOS transistor are coupled in parallel with the first capacitor;
a source and a drain of the third MOS transistor are respectively coupled to the first terminal of the first capacitor and the first input terminal of the integrator; and
a source and a drain of the sixth MOS transistor are respectively coupled to the first terminal of the second capacitor and the first input terminal of the integrator.

5. The oscillator circuit of claim 4, wherein the edge triggered flip-flop is a rising edge triggered flip-flop, and is configured to flip the first signal and the second signal only when detecting the rising edge signal output by the comparator.

6. The oscillator circuit of claim 3, further comprising a first resistor, wherein:
the plurality of controlled switching devices comprise first to sixth MOS transistors;
gates of the first MOS transistor, the second MOS transistor and the third MOS transistor are coupled to the first signal; gates of the fourth MOS transistor, the fifth MOS transistor and the sixth MOS transistor are coupled to the second signal;
a first terminal of the first resistor is coupled to ground;
a source and a drain of the first MOS transistor are respectively coupled to a second terminal of the first resistor and the first terminal of the first capacitor;
a source and a drain of the fourth MOS transistor are respectively coupled to the second terminal of the first resistor and the first terminal of the second capacitor;
a second terminal of the first capacitor is coupled to a power supply; a second terminal of the second capacitor is coupled to the power supply;
a source and a drain of the second MOS transistor are coupled in parallel with the second capacitor;
a source and a drain of the fifth MOS transistor are coupled in parallel with the first capacitor;
a source and a drain of the third MOS transistor are respectively coupled to the first terminal of the first capacitor and the first input terminal of the integrator; and
a source and a drain of the sixth MOS transistor are respectively coupled to the first terminal of the second capacitor and the first input terminal of the integrator.

7. The oscillator circuit of claim 6, wherein the edge triggered flip-flop is a falling edge triggered flip-flop, and is configured to flip the first signal and the second signal only when detecting the falling edge signal output by the comparator.

8. The oscillator circuit of claim 1, wherein a second input terminal of the integrator is coupled to a reference voltage.

9. The oscillator circuit of claim 2, wherein the controlled switching devices include a transmission gate.

10. The oscillator circuit of claim 1, wherein:
the integrator comprises an operational amplifier, a second resistor, and a third capacitor;
a first terminal of the second resistor serves as the first input terminal of the integrator;
a second terminal of the second resistor is coupled to the first input terminal of the operational amplifier;
a second input terminal of the operational amplifier is coupled to a reference voltage; and
a terminal of the third capacitor is coupled to the second terminal of the second resistor, and the other terminal is coupled to the output terminal of the operational amplifier.

* * * * *